(12) United States Patent
Kim

(10) Patent No.: US 7,615,490 B2
(45) Date of Patent: Nov. 10, 2009

(54) METHOD FOR FABRICATING LANDING PLUG OF SEMICONDUCTOR DEVICE

(75) Inventor: Jin Soo Kim, Icheon (KR)

(73) Assignee: Hynix Semiconductor Inc., Icheon-shi (KR)

( * ) Notice: Subject to any disclaimer, the term of this patent is extended or adjusted under 35 U.S.C. 154(b) by 11 days.

(21) Appl. No.: 11/964,071

(22) Filed: Dec. 26, 2007

(65) Prior Publication Data

US 2008/0254620 A1 Oct. 16, 2008

(30) Foreign Application Priority Data

Apr. 13, 2007 (KR) .................. 10-2007-0036464
Dec. 3, 2007 (KR) .................. 10-2007-0124574

(51) Int. Cl.
*H01L 21/44* (2006.01)
(52) U.S. Cl. .................. 438/675; 438/778; 438/783; 257/E21.294; 257/E21.646
(58) Field of Classification Search .................. 438/778, 438/783, 784, 788; 257/E21.294, E21.646
See application file for complete search history.

(56) References Cited

U.S. PATENT DOCUMENTS

| 2004/0262769 | A1* | 12/2004 | Park | 257/758 |
| 2008/0081408 | A1* | 4/2008 | Song | 438/239 |
| 2008/0153276 | A1* | 6/2008 | Hwang et al. | 438/586 |
| 2008/0284039 | A1* | 11/2008 | Colburn et al. | 257/774 |

FOREIGN PATENT DOCUMENTS

KR 10-2003-0058638 7/2003

OTHER PUBLICATIONS

Notice of Rejection for Korean Patent Application No. 10-2007-0124574, dated Feb. 25, 2009.

* cited by examiner

*Primary Examiner*—Phuc T Dang
(74) *Attorney, Agent, or Firm*—Marshall, Gerstein & Borun LLP

(57) ABSTRACT

A method of fabricating a landing plug of a semiconductor device includes performing a double patterning process to separately form a landing plug contact hole for a storage node and a landing plug contact hole for a bit line, thereby facilitating forming a device having a half pitch of 30 nm.

9 Claims, 4 Drawing Sheets

METHOD FOR FABRICATING LANDING PLUG OF SEMICONDUCTOR DEVICE

CROSS-REFERENCE TO RELATED APPLICATION

Priority to Korean patent application number 10-2007-0036464 and 10-2007-0124574, respectively filed on Apr. 13, 2007 and Dec. 3, 2007, the disclosures of which are incorporated by reference in their entirety, is claimed.

BACKGROUND OF THE INVENTION

The invention relates to a method of fabricating a landing plug of a semiconductor device, and more specifically, to a method of fabricating a landing plug of a semiconductor device which includes performing a double patterning process to obtain a device having a half pitch of 30 nm.

In forming semiconductor devices, it is difficult to form line/space patterns of 50 nm or less in size in a single exposure using 1.0 (or less) numerical aperture (NA) ArF exposure equipment, even when employing an immersion lithography process. To improve resolution in lithography processes and increase process margins, diversified research on double patterning has been performed. Double patterning is a process wherein a wafer coated with a photoresist material is exposed using two masks, and then developed. Double patterning is used primarily for complicated patterns (i.e., not simple lines or contacts), or for exposure of dense patterns and isolated patterns to increase process margins. The double patterning process involves exposing and etching a first pattern having a spacing that is twice the desired spacing, and then exposing and etching a second pattern having the same pattern spacing between the first pattern. Because the second mask and etching processes are performed after the first mask and etching processes, a degree of overlay can be measured. In relation to this misalignment and other factors, defects may be overcome and desired resolutions can be obtained. However, this technique increases the number of process steps, thereby complicating semiconductor assembly and increasing production costs.

The double patterning process can be performed in a negative tone or in a positive tone. Negative tone double patterning is a method for obtaining a desired pattern by forming a pattern in the first mask process and removing the same pattern in the second mask process. Positive tone double patterning is a method for obtaining a desired pattern by adding a pattern from the first mask process to a pattern from the second mask process.

In prior art processes of manufacturing semiconductor devices, a device having a half pitch of 30 nm has been developed, but it is difficult to perform patterning in devices with such a small half pitch. In order to form a pattern having such a small pitch, the numerical aperture (NA) of exposure equipment is necessarily high and resolution accordingly decreases. Therefore, technical solutions related to both equipment and photoresists are under consideration. Specifically, a double exposure process for exposing a pattern twice is frequently used.

In a conventional landing plug contact forming process, an I-type landing plug contact mask has been used. However, the I-type mask does not completely cover a double-lined word line (gate) and a space of both sides. Thus, it is difficult to form a desired pattern.

SUMMARY OF THE INVENTION

Various embodiments of the invention are provide a method of fabricating a landing plug contact having a hole-type rather than an I-type using a double patterning process.

According to an embodiment of the invention, a method of fabricating a landing plug of a semiconductor device comprises: forming an interlayer insulating film over a semiconductor substrate; etching the interlayer insulating film using a double patterning process to separately form a landing plug contact hole for a storage node and a landing plug contact hole for a bit line; and filling the respective landing plug contact holes for a storage node and for a bit line to form a landing plug. The double patterning process is a lithography process using a first landing plug contact mask and a second landing plug contact mask.

The first landing plug contact mask and the second landing plug contact mask are preferably hole-type masks. Further, the first landing plug contact mask and the second landing plug contact mask are preferably different from each other.

The landing plug contact hole for bit line is preferably formed after the landing plug contact hole for a storage node is formed. Otherwise, the landing plug contact hole for a storage node may be formed after the landing plug contact hole for a bit line is formed.

Preferably, the step of forming an interlayer insulating film comprises: forming a word line pattern on the semiconductor substrate, the semiconductor substrate comprising an isolation film; forming the interlayer insulating film over the word line pattern and the semiconductor substrate; and, planarizing the interlayer insulating film to expose the word line pattern.

Preferably, the double patterning process further comprises, in any order: etching the interlayer insulating film using a first lithography process with a landing plug contact mask for a storage node to form the landing plug contact hole for a storage node; and, etching the interlayer insulating film using a second lithography process with a landing plug contact mask for a bit line to form the landing plug contact hole for a bit line.

The landing plug contact mask for storage node is preferably a hole-type. The landing plug contact mask for bit line is preferably a hole-type.

BRIEF DESCRIPTION OF THE DRAWINGS

FIG. 1b is a cross-sectional diagram taken along an X-X' of FIG. 1a.

DETAILED DESCRIPTION OF A SPECIFIC EMBODIMENT

Figure 1A:
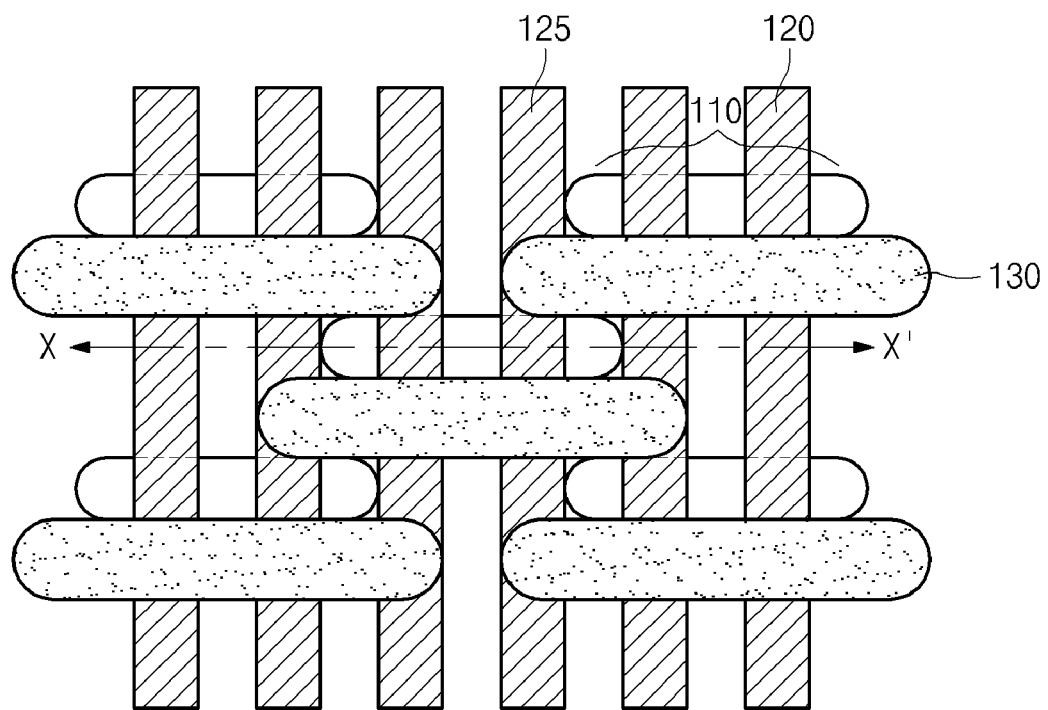
FIG. 1a is a diagram illustrating a process for landing plug contact in a single exposure process using an I-type mask.
Figure 1B:
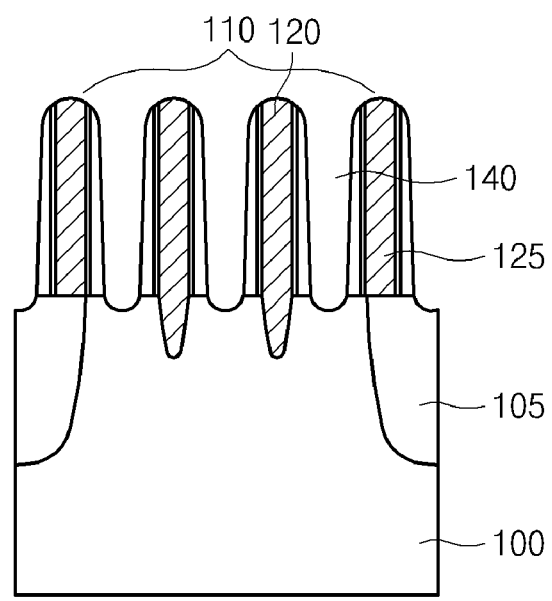

FIG. 1a is a diagram illustrating a process for landing plug contact in a single exposure process using an I-type mask, and FIG. 1b is a cross-sectional diagram taken along X-X' FIG. 1a.

Referring to FIGS. 1a and 1b, a landing plug contact is formed with an I-type mask 130 (FIG. 1a) over a semiconductor substrate 100 (FIG. 1b). Referring to FIG. 1b, an interlayer insulating film between a gate 120 and a dummy gate 125 is opened at once with the I-type mask 130 to form a contact 140 in a word line space over an active region 110 defined by an isolation film 105. That is, the region except the I-type landing plug contact mask 130 is opened. However, when a pattern having a half pitch of less than 30 nm is formed, it is difficult for the I-type mask 130 to cover the gate 120 (e.g., a double-lined word line) and a space of both sides. Therefore, a contact is formed between the active region 110 and both ends of the active region 110 so that the contact may be coupled with a contact of the active region 110.

In order to prevent contact coupling, a double patterning process is performed: a storage node to be formed is opened with a hole-type landing plug contact mask for a storage node, and a bit line to be formed is opened with a hole-type landing plug contact mask for bit line.

FIGS. 2a to 2f are cross-sectional diagrams illustrating a method of fabricating a landing plug of a semiconductor device using a double patterning process according to an embodiment of the invention.

Figure 2A:
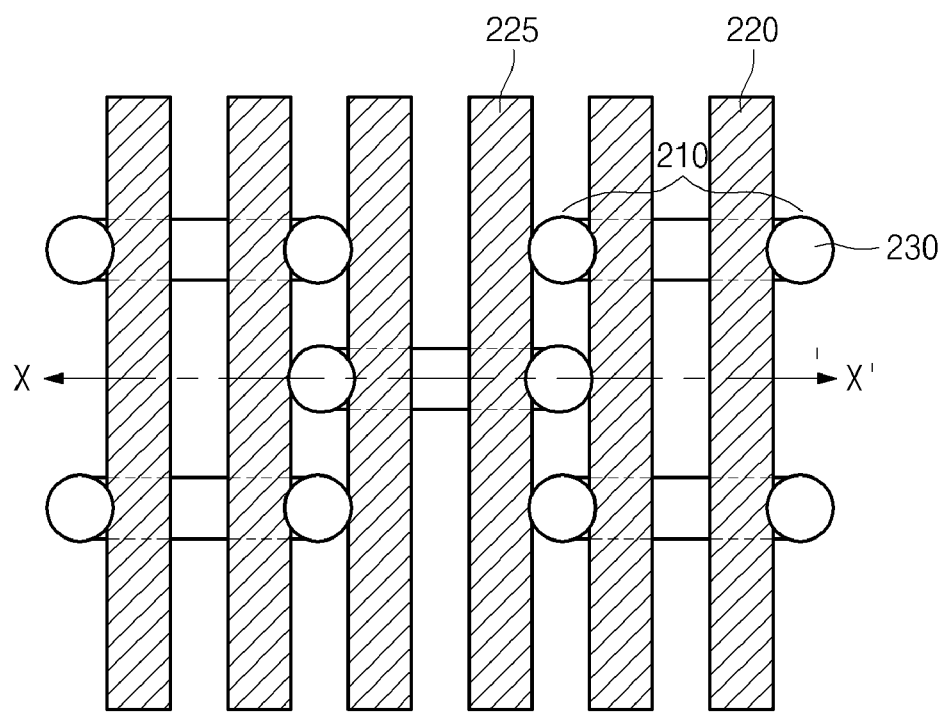
FIGS. 2a to 2f are cross-sectional diagrams illustrating a method of fabricating a landing plug of a semiconductor device using a double patterning process according to an embodiment of the invention.
Figure 2B:
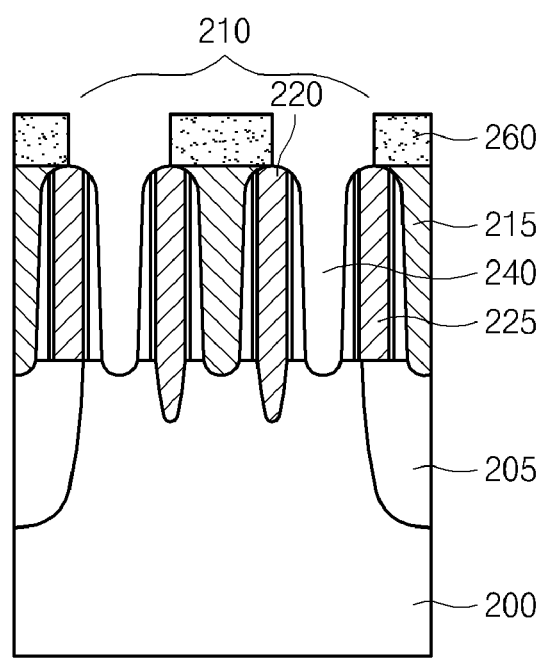

Referring to FIGS. 2a and 2b, a predetermined active region 210 defined by an isolation film 205 (FIG. 2b) includes a word line 220 and a dummy gate 225 formed over a semiconductor substrate 200 (FIG. 2b). An interlayer insulating film 215 (FIG. 2b) is formed over the word line 220, and the interlayer insulating film 215 is then planarized to expose the word line 220. A photoresist film (positive resist, not shown) is formed over the resulting structure. The photoresist film is exposed and developed with a landing plug contact mask 230 for a storage node to be formed at both ends of the active region 210, thereby obtaining a first photoresist pattern 260 (FIG. 2b) which defines a storage node to be formed. The landing plug contact mask 230 for a storage node is a hole-type mask, and the region under the hole is opened. The interlayer insulating film 215 is opened with the first photoresist pattern 260 to form a landing plug contact 240 in the storage node to be formed. FIG. 2b is a cross-sectional diagram taken along X-X' of FIG. 2a. After the interlayer insulating film 215 is exposed by the first photoresist pattern 260, only the interlayer insulating film 215 for the storage node to be formed is removed (i.e., where the landing plug contact 240 is formed).

Figure 2C:
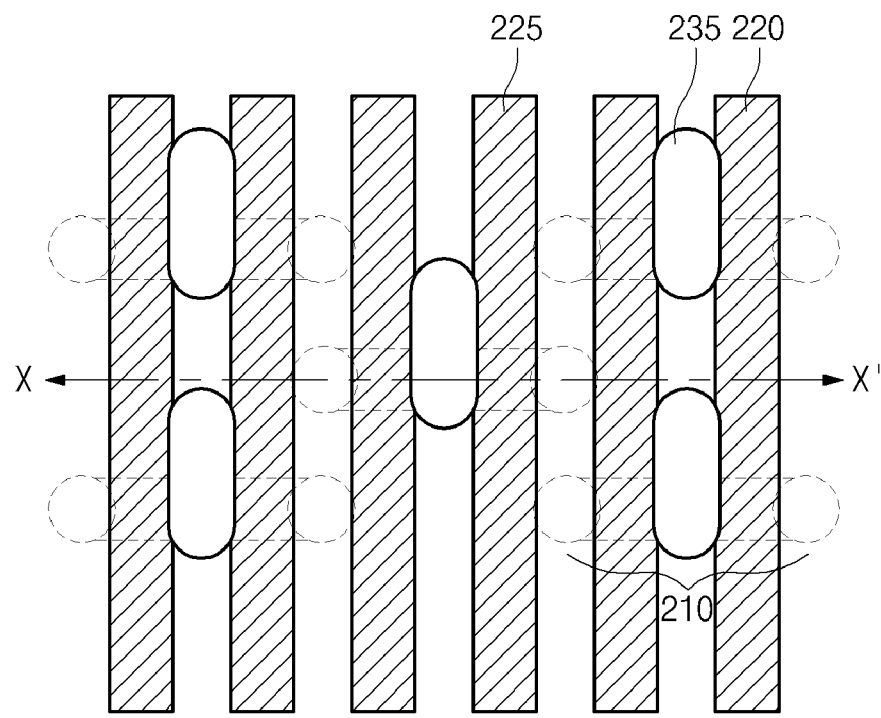
Figure 2D:
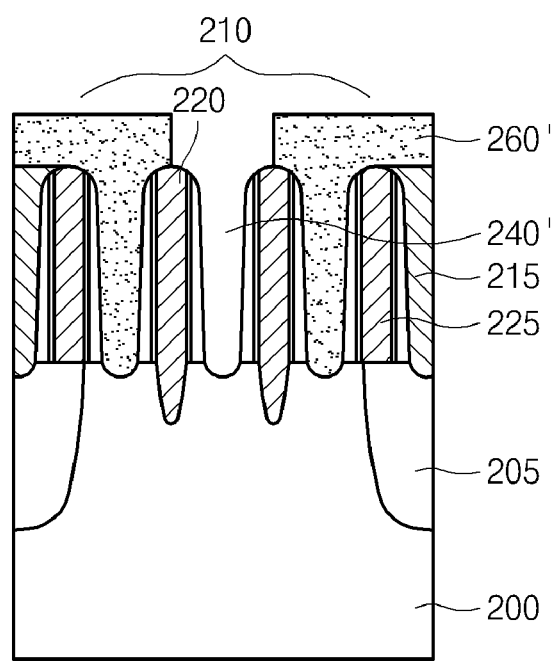

Referring to FIGS. 2c and 2d, a photoresist film (positive resist, not shown) is formed over the resulting structure. The photoresist film is exposed and developed with a landing plug contact mask 235 for a bit line to be formed between the storage node to be formed, thereby obtaining a second photoresist pattern 260' that defines the bit line to be formed. The landing plug contact mask 235 for a bit line preferably is a hole-type mask (although a line type mask also can be used), and the region under the hole is opened. The interlayer insulating film 215 is opened with the second photoresist pattern 260' to form a landing plug contact 240' in the bit line to be formed. FIG. 2d is a cross-sectional diagram taken along X-X' of FIG. 2c. After the interlayer insulating film is exposed by the second photoresist pattern 260', only the interlayer insulating film 215 for the bit line to be formed is removed (i.e., where the landing plug contact 240' is formed).

Figure 2E:
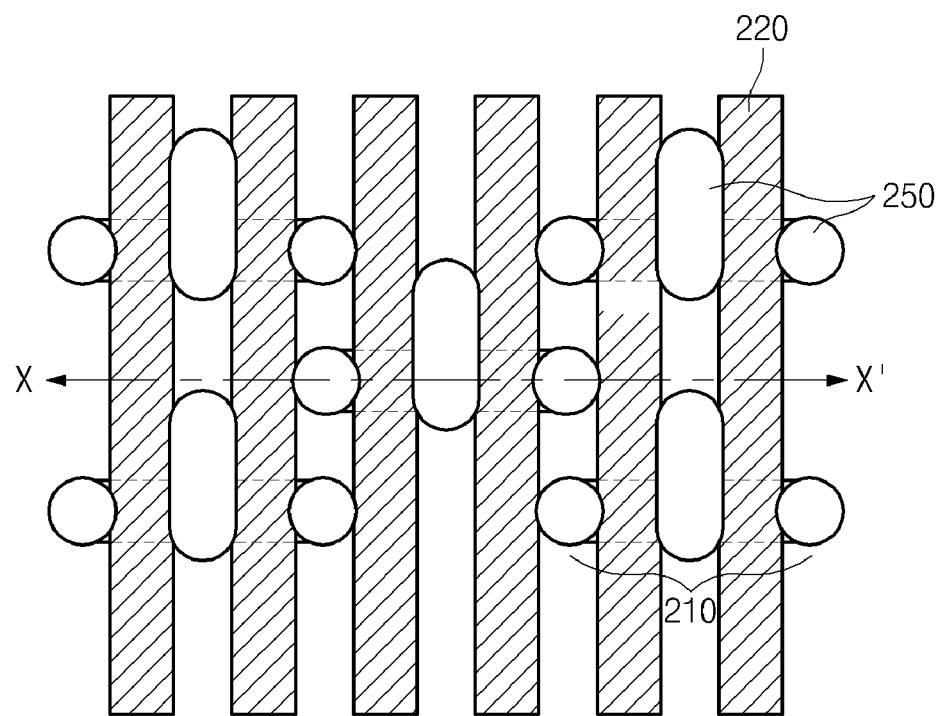
Figure 2F:
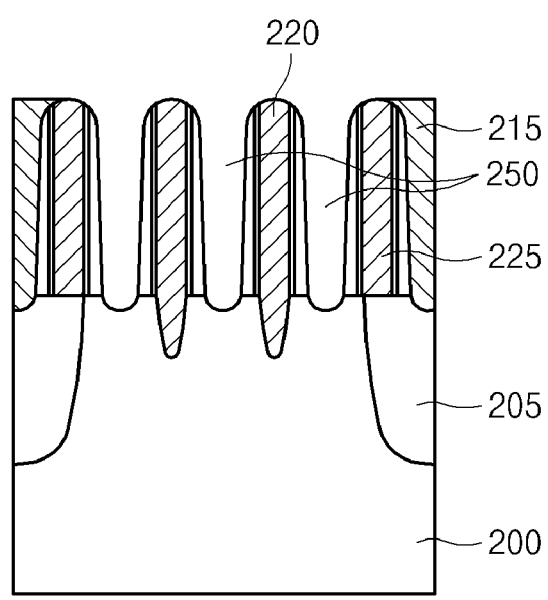

Referring to FIG. 2e, the double patterning method facilitates forming a landing plug contact 250 in the storage node to be formed and the bit line to be formed of the active region 210. FIG. 2f is a cross-sectional diagram taken along X-X' of FIG. 2e. The opened region is then filled to form a predetermined landing plug (not shown).

Also, there is provided a semiconductor device manufactured by the disclosed method of fabricating a landing plug.

As described above, according to an embodiment of the invention, a method of fabricating a landing plug of a semiconductor device includes performing a double patterning process to facilitate forming a device having a half pitch of 30 nm.

The above embodiments of the invention are illustrative and not limiting. Various alternatives and equivalents are possible. The invention is not limited by the lithography steps described herein. Nor is the invention limited to any specific type of semiconductor device. For example, the invention may be implemented in a dynamic random access memory (DRAM) device or non-volatile memory device. Other additions, subtractions, or modifications that may be obvious in view of the disclosure are intended to fall within the scope of the appended claims.

What is claimed is:

1. A method of fabricating a landing plug of a semiconductor device, the method comprising:
    forming an interlayer insulating film over a semiconductor substrate;
    etching the interlayer insulating film by a lithography process using a first landing plug contact mask and a second landing plug contact mask to separately form a landing plug contact hole for a storage node and a landing plug contact hole for a bit line; and
    thereafter filling both the landing plug contact hole for a storage node and the landing plug contact hole for a bit line to form a landing plug.

2. The method according to claim 1, wherein the first landing plug contact mask and the second landing plug contact mask is a hole-type mask respectively.

3. The method according to claim 1, wherein the first landing plug contact mask and the second landing plug contact mask is different each other.

4. The method according to claim 1, wherein forming an interlayer insulating film comprises:
    forming a word line pattern on the semiconductor substrate, the semiconductor substrate comprising an isolation film;
    forming the interlayer insulating film over the word line pattern and the semiconductor substrate; and,
    planarizing the interlayer insulating film to expose the word line pattern.

5. The method according to claim 1, wherein the lithography process further comprises, in any order:
    etching the interlayer insulating film using a first lithography process with a landing plug contact mask for a storage node to form the landing plug contact hole for a storage node; and,
    etching the interlayer insulating film using a second lithography process with a landing plug contact mask for a bit line to form the landing plug contact hole for a bit line.

6. The method according to claim 5, wherein the lithography process comprises first forming the landing plug contact hole for a storage node and then forming the landing plug contact hole for a bit line.

7. The method according to claim 5, wherein the lithography process comprises first forming the landing plug contact hole for a bit line and then forming the landing plug contact hole for a storage node.

8. The method according to claim 5, wherein the landing plug contact mask for a storage node is a hole-type mask.

9. The method according to claim 5, wherein the landing plug contact mask for a bit line is a hole-type mask.

* * * * *